United States Patent [19]

Gerber

[11] 4,167,697
[45] Sep. 11, 1979

[54] CAPACITIVE PICK-OFF CIRCUIT

[75] Inventor: Joseph P. Gerber, Redmond, Wash.

[73] Assignee: Sundstrand Data Control, Inc., Redmond, Wash.

[21] Appl. No.: 876,602

[22] Filed: Feb. 10, 1978

[51] Int. Cl.$^2$ ............................................. G01R 27/26
[52] U.S. Cl. .................................................. 324/60 C
[58] Field of Search ............. 324/60 R, 60 C, 60 CD, 324/61 R

[56] References Cited

U.S. PATENT DOCUMENTS

| | | | |
|---|---|---|---|
| 3,487,300 | 12/1969 | Merrell | 324/60 R |
| 3,582,827 | 6/1971 | Bjerede | 324/61 R |
| 3,641,431 | 2/1972 | Pigage et al. | 324/61 R |
| 3,665,300 | 5/1972 | Sauer et al. | 324/61 R |
| 3,753,373 | 8/1973 | Brown | 324/61 R X |
| 3,757,210 | 9/1973 | Hansen | 324/61 R |
| 3,855,527 | 12/1974 | Masopust, Jr. | 324/60 C |
| 4,096,758 | 6/1978 | Moore | 324/61 R X |

Primary Examiner—Stanley T. Krawczewicz
Attorney, Agent, or Firm—Ted E. Killingsworth; Michael B. McMurry; William R. Peoples

[57] ABSTRACT

An improved capacitive pick-off circuit is provided by utilizing an operational amplifier wherein a pick-off capacitor to be measured forms a part of a feedback circuit of the operational amplifier resulting in the gain of the operational amplifier becoming inversely proportional to the capacitance or directly proportional to the gap between the plates of the capacitor thereby providing a measure of capacitance. A differential capacitive pick-off circuit is implemented by using a pair of operational amplifiers wherein feedback circuits controlling the gain of the operational amplifiers include pick-off capacitors to be measured and a third differential amplifier is connected to the outputs of the two operational amplifiers to provide a signal representing the difference in capacitance between the two pick-off capacitors.

10 Claims, 1 Drawing Figure

CAPACITIVE PICK-OFF CIRCUIT

BACKGROUND OF THE INVENTION

The invention relates to capacitive pick-off circuits; that is, circuits that are used to determine the capacitance or the gap between plates of a capacitor.

In prior art capacitive pick-off systems, such as described in the copending application of Holdren et al Ser. No. 702,389, filed on July 6, 1976, assigned to the assignee of this application, capacitance is measured by applying a time varying voltage such as a triangular or saw-tooth waveform to the capacitor plates. The resulting current through the capacitor is then used as a measure of the capacitance or the gap between the plates of the capacitor. However, due to the fact that the capacitance of the capacitor varies in an inverse relationship with the distance or gap between the plates, a change in this gap will result in nonlinearities in the output current which can, under some circumstances and in certain applications of capacitive pick-off circuits, lead to significant errors. For example, a ten percent change in the gap will give rise to over a one percent nonlinearity, a twenty percent gap change will give rise to over a four percent nonlinearity and a fifty percent gap change will result in a thirty percent nonlinearity. Also, since the output current of the capacitor increases substantially as the plate gap becomes very small, significant stability problems can appear when the capacitor is used as a position sensing element in a servoed device. Capacitive pick-off circuits are used in a large number instrumentation type applications such as transducers and accelerometers and for some highly sensitive instruments such as servoed accelerometers and transducers where nonlinearities due to significant changes in the capacitor plate gap can be a significant source of error.

SUMMARY OF THE INVENTION

It is therefore an object of the invention to provide a capacitive pick-off circuit which will tend to eliminate nonlinearities due to changes in the gap or distance between pick-off capacitor plates wherein a pick-off capacitor forms a portion of a feedback circuit of an operational amplifier and wherein the gain of the operational amplifier is directly related to the capacitance of the pick-off capacitor. A source of time varying voltage is applied to the operational amplifier and the resulting output voltage of the operational amplifier provides a measure of the pick-off capacitor capacitance.

It is an additional object of the invention to provide a differential capacitive pick-off circuit which will eliminate nonlinearities due to the varying distance between the plates in the pick-off capacitors wherein the circuit includes a pair of operational amplifiers having feedback circuits that include the pick-off capacitors. Each pick-off capacitor is effective to control the gain of one of the operational amplifiers and a time varying voltage applied to the inputs of the operational amplifiers results in output voltages for each of the operational amplifiers which in turn are applied to a differential amplifier that produces an output voltage representative of the difference in capacitance of the pick-off capacitors.

DETAILED DESCRIPTION OF THE INVENTION

Figure 1:
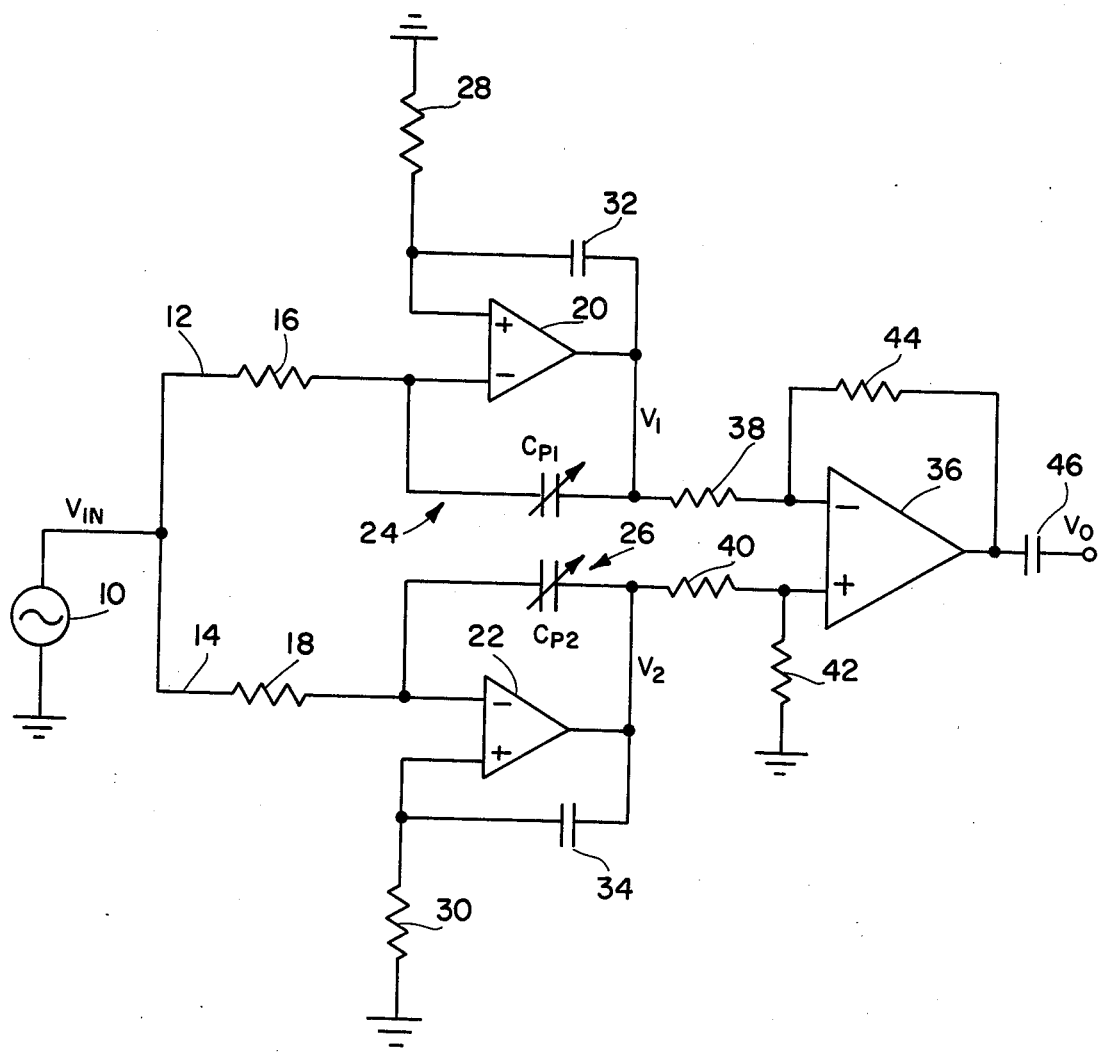
FIG. 1 is a schematic diagram of a differential pick-off circuit according to the invention.

Illustrated in FIG. 1 is a schematic diagram of the preferred embodiment of the invention which is a differential capacitive pick-off circuit including a pair of pick-off capacitors $C_{P1}$ and $C_{P2}$. Pick-off capacitors such as $C_{P1}$ and $C_{P2}$ are typically used as position detecting elements in various types of instrumentation including transducers, accelerometers and the like. As shown in FIG. 1, a source of time varying voltage 10 applies to a sinusoidal voltage $V_{IN}$ by means of lines 12 and 14 and resistors 16 and 18 to an inverting input of a pair of operational amplifiers 20 and 22. Each of the operational amplifiers 20 and 22 includes a feedback circuit indicated at 24 and 26 that includes pick-off capacitors $C_{P1}$ and $C_{P2}$. Since $C_{P1}$ and $C_{P2}$ are located in the negative feedback loops of amplifiers 20 and 22, they are effective in combination with the resistors 16 and 18 to control the gain to the output voltages $V_1$ and $V_2$ of the operational amplifiers 20 and 22. Due to the fact that the operational amplifiers 20 and 22 in effect utilize the capacitor plates of the pick-off capacitors $C_{P1}$ and $C_{P2}$ as feedback elements, the amplifier gain will be an inverse function of the capacitance of the pick-off capacitors $C_{P1}$ and $C_{P2}$ and the outputs $V_1$ and $V_2$ of the amplifiers 20 and 22 will be linear functions of the capacitor plate gaps.

In the preferred embodiment of the invention shown in FIG. 1 noninverting inputs of each of the operational amplifiers 20 and 22 are connected to ground by means of resistors 28 and 30. In addition, capacitors 32 and 34 are provided in a feedback relationship between the output terminals and the noninverting terminals of the operational amplifiers 20 and 22. Capacitors 32 and 34 can be used to balance out stray capacitances in the circuit.

A differential amplifier 36 provides a means for combining the outputs of operational amplifiers 20 and 22 to generate a signal representing the difference in capacitance between capacitors $C_{P1}$ and $C_{P2}$. The output $V_1$ of amplifier 20 is applied through a resistor 38 to an inverting input of amplifier 36. Similarly, the output $V_2$ of amplifier 22 is applied through a resistor 40 to a noninverting input of amplifier 36. The noninverting input of amplifier 36 is connected to ground by means of a resistor 42 and a feedback circuit including a resistor or impedance 44 connects the output of amplifier 36 with the inverting input. The output terminal of the capacitive pick-off circuit of FIG. 1 is connected by means of a capacitor 46 to the output of amplifier 36 and produces thereon the output voltage $V_O$.

Operation of the differential pick-off circuit illustrated in FIG. 1 is described by the following equations where the input voltage $V_{IN}$ is represented by:

$$V_{IN} = V_A \sin \omega t \qquad \text{Equation (1)}$$

The output voltages $V_1$ and $V_2$ of amplifiers 20 and 22 are then represented by:

$$V_1 = \frac{V_A}{R_{16} C_{P1}} \cos \omega t \qquad \text{Equation (2)}$$

and $$V_2 = \frac{V_A}{R_{18} C_{P2}} \cos \omega t \qquad \text{Equation (3)}$$

Since the output voltage of the differential amplifier 36 is equal to $$V_O = V_2 - V_1 \qquad \text{Equation (4)}$$

the substitution of Equations (2) and (3) in Equation (4) results in the following expression for the output voltage $V_O$:

$$V_O = V_A \left( \frac{1}{R_{16}C_{P1}} - \frac{1}{R_{18}C_{P2}} \right) \cos \omega t \qquad \text{Equation (5)}$$

By including the formula for the capacitance of a parallel plate capacitor $$C = \frac{\epsilon_o A}{D} \qquad \text{Equation (6)}$$

where A is the area of the capacitor plates, D is the gap or distance between the plates and $\epsilon_o$ is the permitivity constant, for the pick-off capacitors $C_{P1}$ and $C_{P2}$ in Equation (5) the following relationship emerges:

$$V_O = V_A \left( \frac{D_1}{R_{16} \epsilon_o A_1} - \frac{D_2}{R_{18} \epsilon_o A_2} \right) \cos \omega t \qquad \text{Equation (7)}$$

Then if the resistances $R_{16}$ and $R_{18}$ are equal and if the areas of $A_1$ and $A_2$ of the pick-off capacitors are equal as well, the output voltage $V_O$ will be directly related to the distance between the plates as shown below:

$$V_O = \frac{V_A}{RA \epsilon_o} (D_1 - D_2) \cos \omega t \qquad \text{Equation (8)}$$

Therefore it can be appreciated that the output voltage $V_O$ of the circuit illustrated in FIG. 1 will represent in a linear manner the difference in gaps between the plates of capacitors $C_{P1}$ and $C_{P2}$.

I claim:

1. A differential capacitive pick-off circuit for measuring the relative capacitances of a first capacitor and a second capacitor comprising:
   a source of time varying voltage;
   a first operational amplifier including a first input terminal connected to said voltage source and an output terminal;
   a first feedback circuit, including the first capacitor, connecting said first amplifier first input terminal to said first amplifier output terminal wherein the first capacitor is effective to control the gain of said first amplifier;
   a second operational amplifier including a first input terminal connected to said voltage source and an output terminal;
   a second feedback circuit, including the second capacitor, connecting said second amplifier first input terminal to said second amplifier output terminal wherein the second capacitor is effective to control the gain of said second amplifier; and
   means for combining the outputs of said first and second amplifiers to generate a signal representing the difference in capacitance between the first and second capacitors.

2. The circuit of claim 1 wherein said time varying voltage is a sinusoidal voltage.

3. The circuit of claim 1 wherein both said first and second amplifiers include a second input terminal which is connected to ground.

4. The circuit of claim 3 additionally including a third feedback circuit, which includes a third capacitor, connected between the first amplifier output terminal and said second input terminal and a fourth feedback circuit, which includes a fourth capacitance, connected between said second amplifier output terminal and said second input terminal.

5. The circuit of claim 1 wherein said first and second amplifier first input terminals are inverting input terminals.

6. The circuit of claim 1 wherein said combining means includes a third operational amplifier having an inverting and a noninverting input wherein said first amplifier output terminal is connected to said third amplifier inverting input and said second amplifier output terminal is connected to said third amplifier noninverting input.

7. The circuit of claim 6 additionally including a fifth feedback circuit connected between an output of said third amplifier and said third amplifier inverting input.

8. A differential capacitive pick-off circuit for measuring the relative capacitances of a first and a second capacitor comprising:
   a source of a sinusoidal input voltage;
   a first operational amplifier including an inverting and a noninverting input terminal as well as an output terminal wherein said inverting input is connected to said voltage source;
   a second operational amplifier including an inverting and a noninverting input terminal as well as an output terminal wherein said inverting input is connected to said voltage source;
   a first feedback circuit, including the first capacitor, connecting said first amplifier output terminal to said first amplifier inverting input;
   a second feedback circuit, including the second capacitor, connecting said second amplifier output terminal to said second amplifier inverting input; and
   a third operational amplifier including an inverting terminal connected to said first amplifier output terminal and a noninverting terminal connected to said second amplifier output terminal.

9. The circuit of claim 8 additionally including a third feedback circuit, including a third capacitor, connected between said first amplifier noninverting input terminal and said first amplifier output terminal and a fourth feedback circuit, including a fourth capacitor, connected between said second amplifier noninverting input terminal and said second amplifier output terminal.

10. The circuit of claim 9 additionally including a fifth feedback circuit, including a resistance, connected between said third amplifier inverting input terminal and said third amplifier output terminal.

* * * * *